(12) United States Patent
Dimmick et al.

(10) Patent No.: US 7,539,361 B2
(45) Date of Patent: May 26, 2009

(54) FIBER OPTIC DEVICE FOR MEASURING A PARAMETER OF INTEREST

(75) Inventors: Timothy E. Dimmick, Oviedo, FL (US); Kevin H. Smith, West Melbourne, FL (US); Douglas J. Markos, West Melbourne, FL (US)

(73) Assignee: Harris Corporation, Melbourne, FL (US)

( * ) Notice: Subject to any disclaimer, the term of this patent is extended or adjusted under 35 U.S.C. 154(b) by 9 days.

(21) Appl. No.: 11/538,954

(22) Filed: Oct. 5, 2006

(65) Prior Publication Data

US 2008/0085080 A1  Apr. 10, 2008

(51) Int. Cl.
  *G02B 6/00* (2006.01)
(52) U.S. Cl. .............................. 385/12; 385/13; 385/37; 385/124; 385/125
(58) Field of Classification Search ................. None
  See application file for complete search history.

(56) References Cited

U.S. PATENT DOCUMENTS

| | | |
|---|---|---|
| 4,201,446 A | 5/1980 | Geddes et al. |
| 4,823,166 A | 4/1989 | Hartog et al. |
| 4,986,624 A | 1/1991 | Sorin et al. |
| 5,102,232 A | 4/1992 | Tanabe et al. |
| 5,774,619 A | 6/1998 | Bruesselbach |
| 5,825,804 A | 10/1998 | Sai |
| 6,011,881 A | 1/2000 | Moslehi et al. |
| 6,052,497 A | 4/2000 | Graebner |
| 6,104,852 A * | 8/2000 | Kashyap ................ 385/123 |
| 6,295,304 B1 | 9/2001 | Koch et al. |
| 6,389,200 B1 | 5/2002 | Foltzer |

(Continued)

FOREIGN PATENT DOCUMENTS

WO     WO 01/93466 A2     12/2001

(Continued)

OTHER PUBLICATIONS

U.S. Appl. No. 11/538,947, Dimmick, Timothy E. et al.

(Continued)

*Primary Examiner*—Sung H Pak
*Assistant Examiner*—Chad H Smith
(74) *Attorney, Agent, or Firm*—Darby & Darby PC; Robert J. Sacco

(57) ABSTRACT

An optical fiber (100) utilized as a sensor for measuring a parameter of interest 122 such as temperature, strain, photonic energy intensity, electric field intensity and magnetic field intensity is provided. A first optical cladding layer (104) is disposed on an optically transmissive core (102) that includes one or more optical gratings (114-1). The optical grating(s) (114-1) modifies a propagation path of selected wavelengths of light propagating through the core (102). The optical grating(s) (114-1) also varies the index of refraction of the first optical cladding layer (104). The selected wavelengths of light are determined in part by the index of refraction of the core material 105 as dependent upon a parameter of interest 122 applied to the core material 105 and as varied by the optical grating(s) (114-1). One or more detectors (410, 430, 450, 455) are used for determining the properties of the reflected and/or transmitted light. Knowing the properties of the reflected and/or transmitted light, a parameter of interest 122 can be determined.

28 Claims, 8 Drawing Sheets

U.S. PATENT DOCUMENTS

| | | |
|---|---|---|
| 6,563,985 B2 | 5/2003 | Yin et al. |
| 6,608,952 B2 | 8/2003 | Eggleton et al. |
| 6,768,839 B2 | 7/2004 | Blomquist et al. |
| 6,804,041 B1 | 10/2004 | Giakos |
| 6,819,845 B2 | 11/2004 | Lee et al. |
| 6,859,567 B2 | 2/2005 | Galstian et al. |
| 6,859,583 B2 | 2/2005 | Lachance et al. |
| 7,027,699 B2 | 4/2006 | Tao et al. |
| 7,224,881 B2 | 5/2007 | Aoki et al. |
| 2002/0009252 A1 | 1/2002 | Maron et al. |
| 2003/0133657 A1 | 7/2003 | Kochergin et al. |
| 2003/0166687 A1* | 9/2003 | Warpehoski et al. ........ 514/341 |
| 2003/0169987 A1* | 9/2003 | Eggleton et al. ............ 385/125 |
| 2004/0151433 A1 | 8/2004 | Galstian et al. |
| 2004/0151467 A1* | 8/2004 | Ishikawa et al. ............ 385/144 |
| 2004/0165809 A1 | 8/2004 | Kersey et al. |
| 2005/0018945 A1* | 1/2005 | Dunphy et al. ................ 385/12 |
| 2006/0088267 A1 | 4/2006 | Fukuda et al. |

FOREIGN PATENT DOCUMENTS

WO    WO 2004/001357 A1    12/2003

OTHER PUBLICATIONS

U.S. Appl. No. 11/538,939, Dimmick, Timothy E.

Markos, Doug J., et al., "Bragg Grating Temperature Sensor in Photosensitive Capillary Waveguide" International Conference on Optical Fiber Sensors. Advanced Sensing Photonics, XX, XX, Oct. 23, 2006 pp. 1-4.

\* cited by examiner

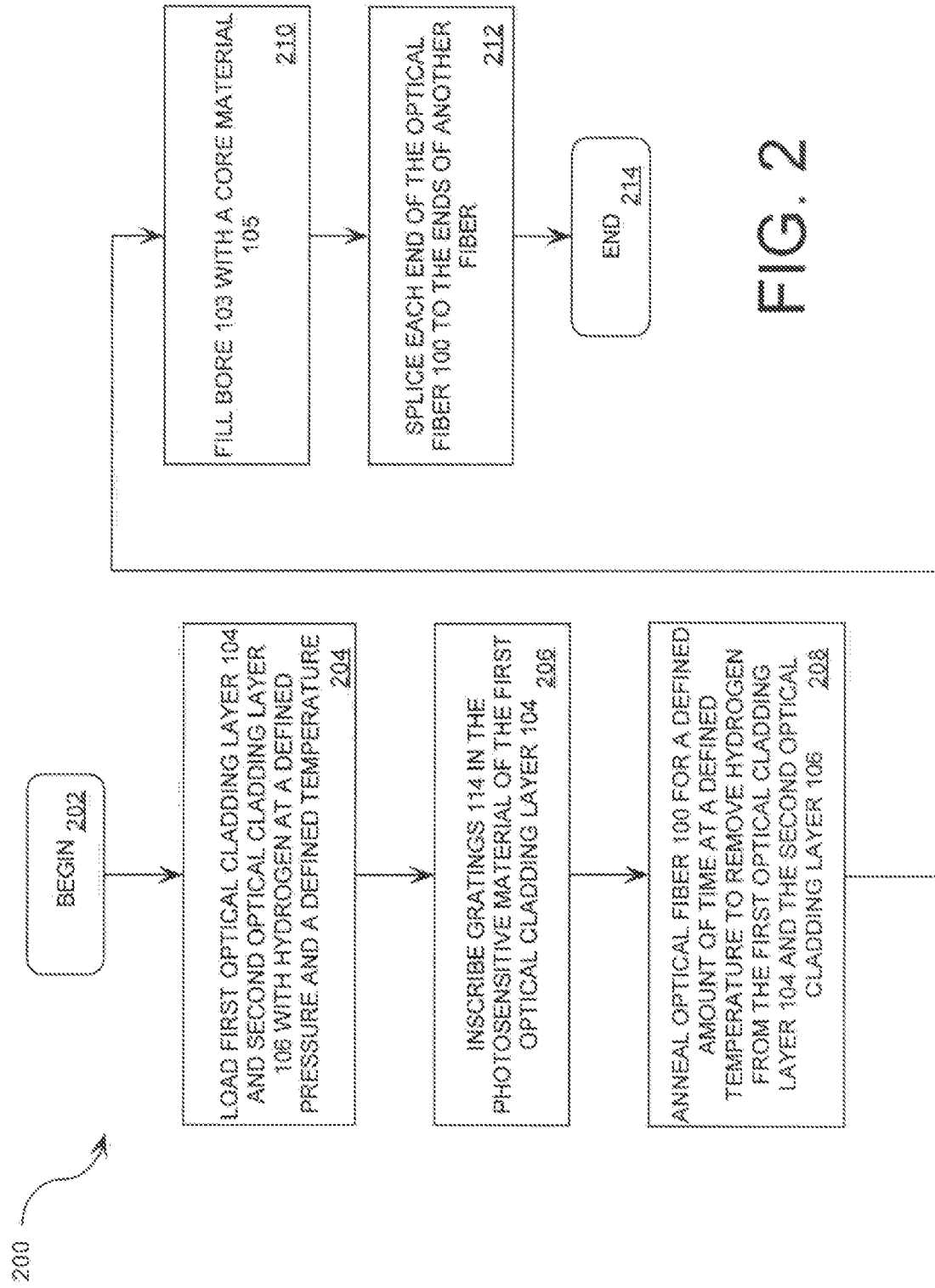

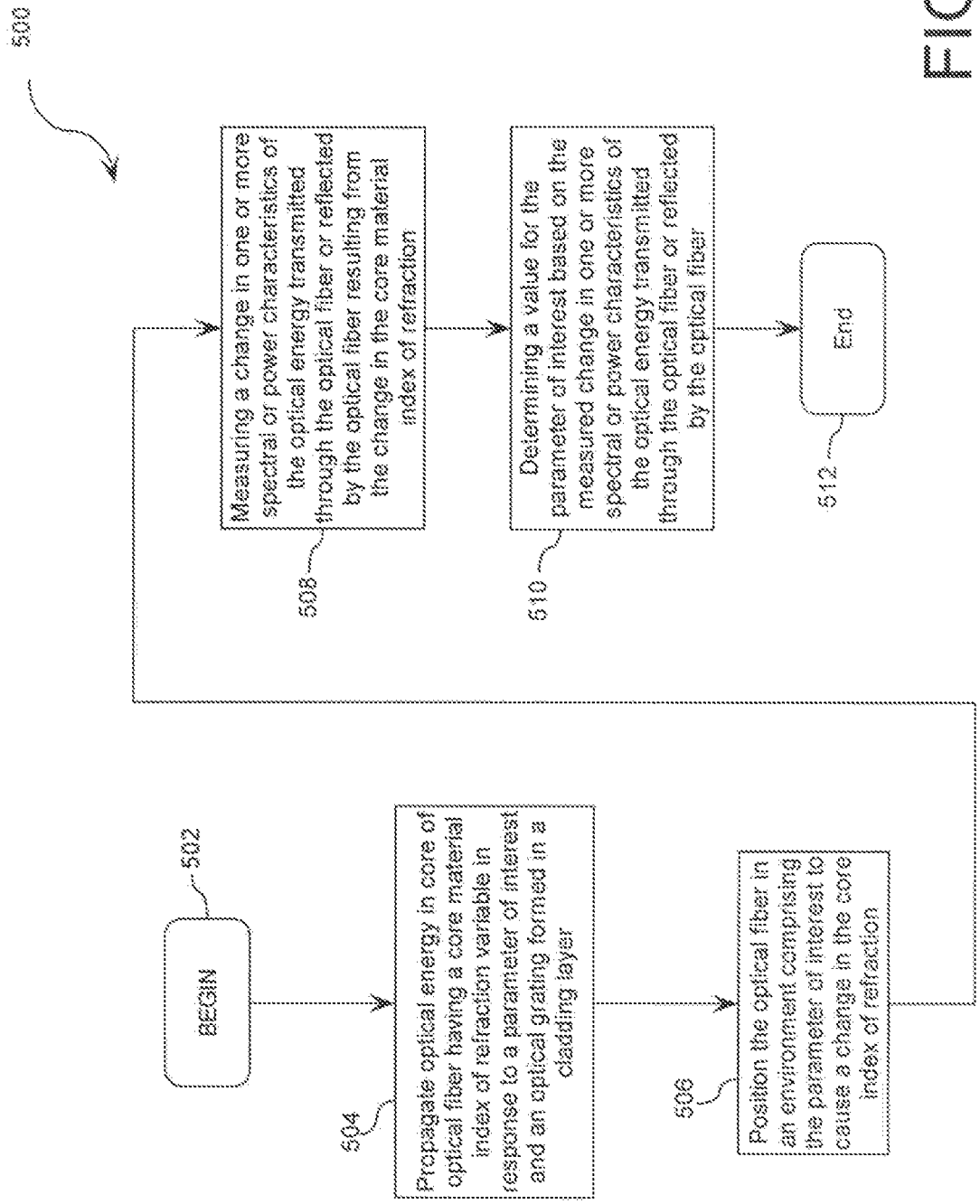

FIBER OPTIC DEVICE FOR MEASURING A PARAMETER OF INTEREST

BACKGROUND OF THE INVENTION

1. Statement of the Technical Field

The invention concerns fiber optic devices, and more particularly, fiber optic devices utilized as a sensor for measuring a parameter of interest such as temperature.

2. Description of the Related Art

It is known in the art to utilize fiber optic devices for filtering an optical signal or measuring parameters of interest related to light propagating through an optical fiber. Optical fibers can be used for measuring a parameter of interest because changes to the environment in which the fiber resides can result in changes to material properties of the optical fiber that are sufficient to alter one or more characteristics of the propagating light such as the amplitude, phase, frequency, spectral content, or polarization of the light. By detecting the change in one or more of these characteristics, a parameter of interest can be measured. Such parameters of interest include the temperature and/or strain of the optical fiber.

Specifically, the use of an optical fiber to measure a parameter of interest such as temperature has many advantages over conventional sensor types. For example, these advantages include high sensitivity, electrical passiveness, immunity from electromagnetic interference, compatibility with high electric or magnetic fields, multiplexing capabilities, and both point and distributed sensing along the length of the optical fiber. Moreover, as optical fibers are also useful for optical filtering, optical fibers used for sensing purposes may be combined with optical fiber based filtering in order to provide both sensing and processing in a common platform, thereby reducing costs and increasing flexibility.

An example of a known method of measuring a parameter of interest utilizing an optical fiber is disclosed in U.S. Pat. No. 4,823,166 issued to Hartog et al. The method described is known as optical time domain reflectometry (OTDR). A parameter of interest is measured by introducing optical energy into an optical fiber and receiving backscattered light returned from various distances along the optical fiber. In OTDR, a pulse of optical energy is introduced to the optical fiber and the backscattered optical energy returning from the fiber is observed as a function of time, which is proportional to a distance along the fiber from which the back scattered light is received. OTDR is also employed in U.S. Pat. No. 5,825,804 issued to Sai.

In U.S. Pat. No. 7,027,699 issued to Tao et al. another type of optical fiber used for sensing temperature utilizes a grating formed in the fiber known as a Bragg grating. When used for sensing temperature, this type of optical fiber is known as an optical fiber Bragg grating sensor (FBG sensor). An FBG sensor comprises an optical fiber with a grating formed transversely in the core by a method such as exposing the fiber to ultraviolet (UV) radiation. The grating produces a differing refractive index within the core of the optical fiber. When light waves propagate along the core, part of the spectrum is reflected by the grating. The reflected wavelength is known as the Bragg wavelength. The Bragg wavelength varies with events and conditions to which the optical fiber is exposed. In particular, the Bragg wavelength will vary with changes in temperature (T) and when the optical fiber is subjected to some form of strain (S). By measuring the Bragg wavelength, the temperature (T) and strain (S) of the optical fiber can be determined. However, it is usually difficult to measure these two parameters independently of each other. In the '699 patent, this problem is overcome by creating a FBG sensor with multiple dissimilar cores in a single optical fiber.

Two basic types of optical fiber grating systems are known in the art including long period gratings and short period Bragg gratings. Short period fiber gratings are generally characterized as having a sub-micrometer period. These types of devices operate by coupling light from the forward propagating core mode to a backward propagating core mode. In general, the short period fiber Bragg grating will have selected narrow band reflection of specific wavelengths. In contrast, long period gratings in optical fibers typically have a period in the range of a few tens of micrometers to 1 millimeter. Such long period gratings promote coupling between forward propagating core modes and co-propagating cladding modes. Long period gratings generally attenuate a certain wavelength and offer wider bandwidths than short period gratings.

SUMMARY OF THE INVENTION

The invention concerns an optical fiber device for measuring a parameter of interest. The optical fiber device includes an elongated cylindrical core formed of a core material that is optically transmissive and has an index of refraction that is dynamically variably responsive to the parameter of interest. The optical fiber also includes a first optical cladding layer disposed on the core. One or more optical gratings are disposed within the first optical cladding layer. The optical grating varies the index of refraction of the first optical cladding layer in a predetermined pattern for modifying a propagation path of selected wavelengths of light provided to the core by a source of light. The device also includes a detector optically coupled to the optical fiber. The detector is configured for measuring one or more characteristics of selected wavelengths of light propagated along a length of the optical fiber for determining the parameter of interest.

According to one embodiment of the invention, the optical fiber device is comprised of a bore axially disposed within the first optical cladding layer. Further, the core material contained within the bore is a fluid or a liquid. The optical grating is comprised of a portion of the first optical cladding layer which has an index of refraction that is modulated in a periodic pattern along a length of the optical fiber. According to one embodiment, the periodic pattern is comprised of a sinusoidal variation in the index of refraction. The optical grating in another embodiment is an apodized grating. The optical grating in another embodiment is an amplitude modulated grating. The optical grating in another embodiment is a blazed grating. In yet another embodiment, the optical grating is a chirped grating.

The invention also concerns a method of measuring a parameter of interest with an optical fiber device. The method comprises several steps which include propagating light within an optical fiber. The optical fiber in which the light is propagated has a core material having an index of refraction that is continuously variable over a predetermined range of values responsive to a parameter of interest. The method also includes modifying a propagation path of selected wavelengths comprising the light with an optical grating inscribed in a cladding layer disposed about the core. Finally, the process also includes measuring one or more characteristics of selected wavelengths of light having a propagation path that is modified by the optical grating for determining a parameter of interest. According to one aspect, the method can include selecting the core material to be a fluid or a liquid.

BRIEF DESCRIPTION OF THE DRAWINGS

Embodiments will be described with reference to the following drawing figures, in which like numerals represent like items throughout the figures, and in which:

FIG. 2 is a flow diagram of a fabrication process for an optical fiber that is useful for understanding the invention.

FIG. 10 is a flow diagram of a method of determining a parameter of interest utilizing an optical fiber device that is useful for understanding the invention.

DETAILED DESCRIPTION OF THE PREFERRED EMBODIMENTS

Figure 1:
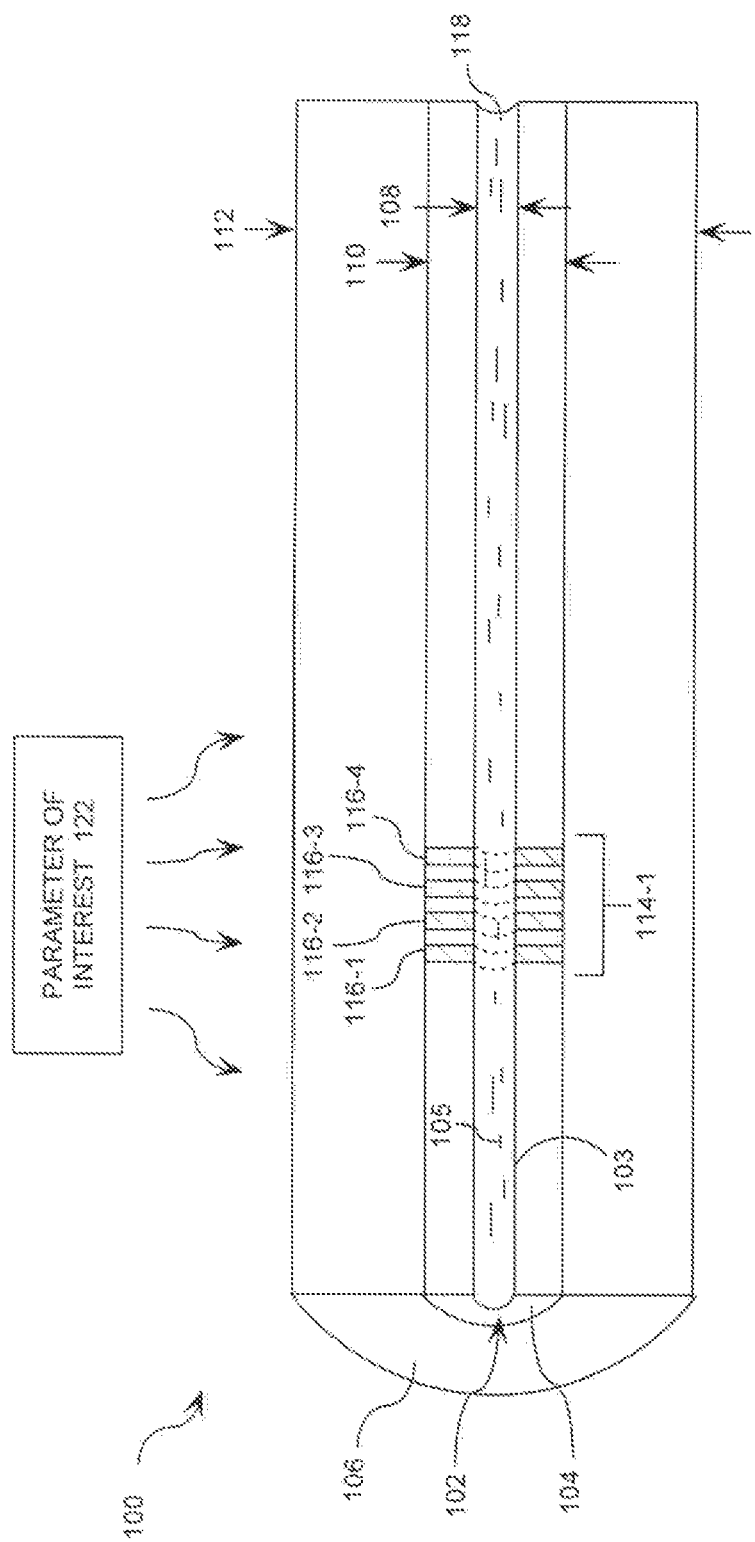
FIG. 1 is a cross-sectional view of an optical fiber that is useful for understanding the invention.

FIG. 1 is a cross-sectional view of an optical fiber 100 that can be utilized as a sensor for measuring a parameter of interest 122 such as temperature. The optical fiber 100 is an elongated structure comprised of a cylindrical core 102, a first optical cladding layer 104, an optical grating 114-1 disposed on the first optical cladding layer 104, and a second optical cladding layer 106. In the preferred embodiment of the invention, the core 102 is cylindrical. However, it should be understood that the cross-section of the core 102 can be of any shape including circular, elliptical, square, rectangular, and octagonal. The core 102 is comprised of a core material 105 to provide a waveguide for the propagation of a desired optical signal through the optical fiber 100. Such core materials include any media having an index of refraction and/or optical loss that is responsive to a parameter of interest such as temperature, photonic energy intensity, electric field intensity, and magnetic field intensity. However, the invention is not limited in this regard as any material responsive to any parameter of interest could be utilized without restriction.

According to a preferred embodiment of the invention shown in FIG. 1, the core 102 is comprised of a bore 103 axially disposed within the first optical cladding layer 104. The bore 103 is further filled with a working fluid or liquid 105 having an index of refraction $n_1$ that is continuously variable over a predetermined range of values responsive to a parameter of interest 122. In this application of an optical fiber 100 being used as a sensor, the optical fiber 100 is disposed in an environment where it is desired to measure the parameter of interest.

With a working fluid 105 disposed within the bore 103, optical fiber 100 can be viewed as a capillary waveguide. Light can propagate within the core 102 in a manner which will be readily understood by those skilled in the art. The working fluid can be selected with an index of refraction $n_1$ in accordance with a particular sensor application. For example, the working fluid is advantageously selected with an index of refraction $n_1$ of between about 1.4 and 1.8 at room temperature. If the parameter of interest that is to be measured is temperature, then the working fluid can be selected to include Series A fluids, Series B fluids, and Series M fluids available from Cargille Labs, Inc., of Cedar Grove, N.J. Such fluids are known to have an index of refraction that varies with temperature. In this application, the optical fiber 100 is disposed in an environment where it can be exposed to temperature changes such that it can be used to measure temperature. Still, the invention is not limited in this regard. Any suitable working fluid can be used provided that it has an index of refraction $n_1$ that is known to vary in a predetermined way in response to variations in temperature.

According to an alternative embodiment of the invention, the bore 103 is filled with an electro-optic working fluid or liquid 105 having an index of refraction $n_1$ that is continuously variable over a predetermined range of values responsive to electric field intensity. In this application, the optical fiber 100 is disposed in an environment where it can be exposed to an electric field such that it can be used to measure the electric field intensity. The electro-optic working fluid is preferably selected with an index of refraction $n_1$ from about 1.4 to 1.8 in the absence of any substantial electric field. Such electro-optic working fluids include liquid crystals and/or electro-optic polymers. Still, the invention is not limited in this regard. Any electro-optic material with an index of refraction $n_1$ that is variable in response to an electric field can be used without limitation.

According to yet another embodiment of the invention, the working fluid or liquid 105 is selected to have an index of refraction $n_1$ that is continuously variable over a predetermined range of values responsive to photonic energy intensity. In this application the optical fiber 100 is disposed in an environment where it can be exposed to photonic energy. According to one aspect of the invention, the working fluid is selected with an index of refraction $n_1$ from about 1.4 to 1.8. Such working fluids advantageously include doped fluids or fluids exhibiting a Kerr nonlinearity. Still, the invention is not limited in this regard. Any working fluid with an index of refraction $n_1$ that is continuously variable in a predetermined way responsive to photonic energy can be used without limitation.

According to another embodiment of the invention, the working fluid or liquid 105 is selected to have an index of refraction $n_1$ that is continuously variable over a predetermined range of values responsive to a magnetic field intensity. In this application, the optical fiber 100 is disposed in an environment where it can be exposed to magnetic fields. Consequently, the optical fiber 100 can be used to measure the magnetic field intensity. The working fluid is preferably selected with an index of refraction $n_1$ from about 1.4 to 1.8 in the absence of any substantial magnetic field. Still, the invention is not limited in this regard. Any working fluid with an index of refraction index $n_1$ that is variable in response to a magnetic field can be used without limitation.

According to yet another embodiment of the invention, the parameter of interest to be measured is strain. In this embodiment, the optical fiber 100 is disposed in an environment where it can be subjected to strain. Consequently, the optical fiber 100 can be used to measure strain. It should be appreciated that working fluids are not sensitive to strain. The strain response of the optical fiber 100 is therefore governed by the response of the cladding materials to strain. The working fluid is preferably selected with an index of refraction $n_1$ from about 1.4 to 1.8. Still, the invention is not limited in this regard. Any working fluid can be used without limitation.

Referring to FIG. 1, it should be appreciated that the characteristics of the light propagating in optical fiber 100 may be simultaneously sensitive to more than one of the parameters of interest listed above, namely: temperature, electric field, photonic energy, magnetic field, or strain. In order to determine the influence of one of these parameters on the characteristics of the propagating light, care must be taken to either eliminate or discriminate between the influence of the other parameters on the characteristics of the propagating light. For example, by externally eliminating strain on optical fiber 100, accurate temperature measurements could be made by choosing a core material that is sensitive only to temperature. Also, discrimination between multiple parameters of interest may be accomplished by measuring multiple characteristics of the light propagating in optical fiber 100 or by inscribing multiple gratings closely spaced on a single optical fiber, with different core materials (sensitive to different parameters of interest) in each grating region. Still, the invention is not limited in this regard. Any method of isolating the influence of a particular parameter of interest, or measuring multiple parameters of interest simultaneously can be used without limitation.

Still referring to FIG. 1, it can be observed that the core 102 has a diameter 108. The diameter 108 is selected by a designer in accordance with a particular optical fiber application using conventional optical fiber design techniques. It should be appreciated that the number of desired core modes will generally tend to dictate the sizing of the core 102. For example, in the preferred embodiment of the present invention, the core 102 has a diameter 108 chosen to produce a capillary waveguide that supports a single propagating core mode throughout the desired wavelength tuning range. The core diameter 108 is also advantageously selected to optimize the optical fiber's sensitivity to a parameter of interest 122, such as temperature, strain, photonic energy intensity, magnetic field intensity, and electric field intensity. It should be understood that the core diameter 108 together with the index of refraction of the core and cladding materials determines the fraction of light carried in the optical fiber 100 that overlaps with the core material 105. In this regard, it should be further understood that the larger the core diameter the larger the fraction of light that is present in the core 102 and the larger the sensitivity to a parameter of interest 122.

The first optical cladding layer 104 is disposed on the core 102. The first optical cladding layer 104 is formed of a material that has a first cladding layer index of refraction that is permanently selectively configurable responsive to an exposure to an external stimulus. For example, the external stimulus can be photonic energy. Such materials include a glass (for example, a silica glass, a fluorozirconate glass, a fluroluminate glass, and chalcogenide glass) doped with photosensitive chemical elements, a polymer doped with photosensitive chemical elements, and/or an electro-optic material doped with photosensitive chemical elements. According to a preferred embodiment of the invention, the material is selected as silica glass doped with germanium to provide ultraviolet (UV) light photosensitivity and fluorine to lower its index of refraction slightly below that of the second optical cladding layer 106. Still, the invention is not limited in this regard. Any suitable material may be used to form the first optical cladding layer 104 without limitation provided that it is sensitive to an energetic stimulus. However, it should be understood that the material used to form the first optical cladding layer 104 is selected with an index of refraction $n_2$ in accordance with a particular sensing operation. For example, the material is selected with an index of refraction $n_2$ less than the index of refraction $n_1$ of the core 102. Such architecture provides an optical fiber with a guided mode that is substantially confined to the fluid or liquid filled core 102 and the region of the first optical cladding layer 104 nearest the core 102.

In the preferred embodiment of the invention shown in FIG. 1, a single optical grating 114-1 is advantageously formed in optical fiber 100. The single optical grating 114-1 is a short period grating. In another embodiment of the invention, the optical grating 114-1 is a long period grating. In yet another embodiment of the invention, there is a plurality of optical gratings 114-1 which can be either short period gratings or long period or any combination thereof.

The optical grating(s) 114-1 are inscribed in the first optical cladding layer 104 using any fabrication technique known in the art. Such techniques include a photo-inscribing technique using an ultraviolet laser and/or any other inscribing technique known in the art. In a preferred embodiment, ultraviolet light is used to create the gratings. An ultraviolet laser is positioned external to the fiber. The laser illuminates the fiber through a phase mask formed from a slab of silica in which there is a pattern of fine parallel grooves or troughs. The phase mask diffracts the light, thereby generating an interference pattern. The result is regions of high and low intensity UV light, which alternate along the length of the fiber in the region where the grating is to be formed. The extent to which the index of refraction varies as a result of this process will depend on several factors. For example, these factors can include the composition of the first optical cladding layer, and the exposure time and intensity of the ultraviolet light.

According to an embodiment of the invention, the optical grating(s) 114-1 is inscribed in a periodic manner in the first optical cladding layer 104 such that the optical grating(s) 114-1 is axially disposed about the core 102. This configuration results in a periodically varying index $n_2$ of the first optical cladding layer 104 along its longitudinal axis. Still, the invention is not limited in this regard. The optical grating(s) 114-1 can be inscribed in a chirped manner. This configuration results in optical grating(s) 114-1 having a grating period that varies along its longitudinal axis. The optical grating(s) 114-1 can also be inscribed in a manner such that optical grating(s) 114-1 are apodized periodic gratings. The optical grating(s) 114-1 can also be inscribed in a manner such that optical grating(s) 114-1 are blazed periodic gratings.

Each optical grating 114-1 can be designed so that an index of refraction of the first optical cladding layer 104 is modulated or varies in a periodic manner along a portion of the length of the optical fiber. For convenience, this periodic variation is illustrated in FIG. 1 as a series of alternating ring-like structures 116-1, 116-2, 116-3, 116-4, 116-5, 116-6, 116-7, and 116-8. However, it should be understood that the actual periodic variation of the index of refraction in the first optical cladding layer 104 does not typically vary in such an abrupt manner. Instead, the index of refraction is varied in a more continuous way. For example, in the embodiment shown, the value of the index of refraction is preferably varied in a sinusoidal manner. The amplitude of the variation in the index of refraction can be constant along the length of the optical grating or it can be modulated along the length of the optical grating. It is known in the art that by modulating the amplitude of the variations in the index of refraction along the length of a grating, it is possible to achieve various different effects upon optical energy propagated along the length of an optical fiber. Any amplitude modulation technique can be used with the present invention.

In FIG. 1 the optical fiber 100 may be configured as a sensor that couples light between a forward propagating core mode and a backward propagating core mode exhibiting a transmission minimum, or a notch, at a wavelength $\lambda_B$ (the Bragg wavelength) by selecting a grating period $\Lambda_{grating}$) using Equation (1):

$$\Lambda_{grating} = \lambda_B / (2 \times n_{eff}) \tag{1}$$

where $n_{eff}$ is the effective index of refraction of the mode guided by the core 102 of the optical fiber 100. The effective index of refraction is the average of the index of refraction of the core 102 and the cladding layers 104, 106 weighted by the fraction of the optical power of the mode occupying those regions. In a fluid filled capillary as provided in FIG. 1, the Bragg wavelength will change as a function of the index of refraction of the fluid because the effective index of refraction is dependent in part on the index of refraction of the fluid. If the index of refraction of the fluid is dependent upon the application of a parameter of interest 122 (e.g., temperature) applied to the fluid in the bore 103, the Bragg wavelength or notch wavelength will be dependent upon the parameter of interest 122. Thus, if the Bragg wavelength or wavelength of the minimum in the transmission spectrum can be determined, the parameter of interest 122 applied to the fluid in the bore 103 can be determined.

Coupled-mode theory (CMT) can be used to model the spectral response of the grating(s) 114-1 shown in FIG. 1. In general, CMT shows that the grating strength and length as well as the overlap of the mode field of the guided mode with the grating perturbation will determine the bandwidth and depth (attenuation) of the notch in the transmission spectrum. It should be appreciated that the optical grating(s) 114-1 interact with light waves propagating along the longitudinal axis of optical fiber 100. This interaction depends on the grating period of each optical grating 114-1. For example, each optical grating 114-1 has a short grating period. The interaction between optical grating(s) 114-1 and light waves guided by the core 102 causes light waves of certain wavelengths to couple from a forward propagating core mode to a backward propagating core mode. In an alternate aspect of the invention, each optical grating 114-1 has a long grating period. The interaction between these optical gratings 114-1 and light waves guided by the core 102 causes light waves of certain wavelengths to couple from a forward propagating core mode to forward propagating cladding modes.

From the foregoing discussion, it will be understood that a parameter of interest can be indirectly determined based on measurement of the Bragg wavelength or notch wavelength produced by the optical grating 114-1 in an optical fiber 100. If the Bragg wavelength of an optical fiber 100 is calibrated with respect to the parameter of interest 122, then the parameter of interest can thereafter be determined based on a measurement of the Bragg wavelength.

However, it should be understood that the Bragg wavelength is not the only characteristic of the fiber 100 that is useful for measuring a parameter of interest. Significantly, a parameter of interest can also be indirectly determined by another method using the optical fiber 100. In particular, a change in the index of refraction of the core material 105 will change the overlap of the core mode with the grating 114-1 causing a measurable variation in a bandwidth of the notch associated with the transmission minimum at the Bragg wavelength. This change in bandwidth can be observed with an optical spectrum analyzer (OSA). The bandwidth of the notch at the transmission minimum associated with the Bragg wavelength of an optical fiber 100 can be calibrated with respect to the parameter of interest 122. Accordingly, the parameter of interest can thereafter be determined based on a measurement of such bandwidth. The bandwidth can be measured using optical energy transmitted through or reflected by the optical fiber 100.

As noted above, the bandwidth of the notch can be measured with an OSA. When a source of optical energy propagated along the optical fiber 100 is a broadband source, then a change in bandwidth of the notch will also result in a change in the total amount of optical energy transmitted or reflected by the optical fiber 100. This change can be measured using an optical power meter. A variation in reflected or transmitted power associated with the broadband optical energy source can be calibrated with respect to the parameter of interest 122. Accordingly, the parameter of interest 122 can thereafter be determined based on a power measurement of broadband optical energy transmitted through or reflected by the optical fiber 100.

Still referring to FIG. 1, the first optical cladding layer 104 has a diameter 110. The diameter 110 can be selected in accordance with a particular optical fiber 100 application. According to a preferred aspect of the invention, the first optical cladding layer 104 advantageously has a diameter 110 that optimizes the interaction of the light propagating in the guided mode with the optical grating(s) 114-1 and the core material 105 occupying bore 103. However, the invention is not limited in this regard. Any suitable diameter 110 can be used in accordance with particular sensing applications.

The second optical cladding layer 106 is disposed on the first optical cladding layer 104. The second optical cladding layer 106 is comprised of dielectric material with a refractive index $n_3$. Such materials include fused silica and/or fused quartz. According to a preferred aspect of the invention, the material forming the second optical cladding layer 106 is selected with a refractive index $n_3$ less than the refractive index $n_1$ of the fluid occupying core 102. According to another aspect of the invention, the material forming the second optical cladding layer 106 is selected with a refractive index $n_3$ equal to or greater than the refractive index $n_2$ of the material forming the first optical cladding layer 104. It should be appreciated that the refractive index $n_3$ could be either less than or greater than the refractive index refractive index $n_2$ of the first optical cladding layer 104, in accordance with a particular sensing application.

As shown in FIG. 1 the second optical cladding layer 106 has a diameter 112. The diameter 112 can be selected in accordance with a particular optical fiber 100 application. According to a preferred aspect of the invention, the second optical cladding layer 106 has a diameter 112 equal to 125 micrometer. Such a diameter 112 provides for compatibility with standard 125 micrometer diameter optical fibers and associated components and tooling. The diameter 112 also provides for a plurality of cladding modes (i.e., allowing multiple resonant bands over the infrared spectrum to propagate in second optical cladding layer 106). However, the invention is not limited in this regard. Any suitable diameter 112 can be used in accordance with particular sensing applications and may be advantageously chosen to select certain cladding modes with which a resonant interaction is desired.

Although a protection layer is not shown in FIG. 1, a person skilled in the art will appreciate that a protection layer can be disposed on the second optical cladding layer 106 for protecting the second optical cladding layer 106 from damage due to environmental conditions and external forces. The protection layer can be comprised of a polymer coating or any other coating known in the art.

A person skilled in the art will appreciate that the optical fiber architectures in FIG. 1 are representative embodiments of optical fiber architecture. However, the invention is not limited in this regard and any other optical fiber architecture can be used without limitation. For example, in an alternate embodiment of the invention, the optical fiber 100 can be designed exclusive of a second optical cladding layer 106. In such a scenario, the first optical cladding layer 104 can be designed as a rather thick layer (for example, 125 micrometers) encompassing the fluid or liquid filled core 102. In such a scenario, a protection layer can be disposed on the first optical cladding layer 104.

FIG. 2 is a flow diagram of a fabrication process for the optical fiber 100. According to the preferred embodiment of the invention, the fabrication process 200 begins with step 202 and continues with step 204. In step 204, an optical fiber 100 having a bore 103, a first optical cladding layer 104, and a second optical cladding layer 106 is sensitized by loading the optical fiber 100 with a gas such as hydrogen or deuterium with a gas absorption method at a defined pressure (for example, 69 MegaPascal1) and a defined temperature (for example, 75° Celsius), for a defined period of time (for example 4 days). Gas absorption methods are well known in the art. Thus, such methods will not be described in great detail herein. Treating the fiber with hydrogen or deuterium before exposing it to ultraviolet light can increase the light sensitivity of the material with regard to modifying the refractive index of the first optical cladding layer 104 to inscribe the optical grating(s) 114-1. However, as is well known in the art, sensitization is not always required and there are other means of sensitizing the cladding layer other than hydrogen loading, such as doping with boron.

After loading the first optical cladding layer 104 and the second optical cladding layer 106 with hydrogen, control passes to step 206. In step 206, at least one short and/or long period grating is inscribed in the first optical cladding layer 104. This step may be accomplished by any method known to a person skilled in the art. For example, a method of inscribing a short period grating involves side exposing the first optical cladding layer 104 behind a phase mask with light of a certain wavelength (for example, 244 nanometer). This process is performed for a given amount of time (for example, 650 seconds) with a given total fluence (for example, 260 kiloJoule/centimeter$^2$). This process will expose the first optical cladding layer to light which varies in intensity in accordance with some pattern defined by the phase mask. As noted above, the first optical cladding layer is formed of a material in which the index of refraction is permanently selectively configurable in response to exposure to selected wavelengths of light. Accordingly, the exposure of the first cladding layer to such light having varying intensity will cause a variation in the index of refraction of the first cladding layer which remains after the light source is removed. The exact pattern of the variation in the index of refraction will be determined by the pattern defined by the phase mask. The pattern can be selected to form an optical grating as described herein.

In step 208, the optical fiber is annealed at a given temperature (for example, 50° Celsius) for a defined amount of time (for example, twelve (12) days) to remove hydrogen from the first optical cladding layer 104 and the second optical cladding layer 106.

In step 210, the bore 103 is filled with a core material 105 having a defined index of refraction (for example, n=1.5) that changes in response to a parameter of interest 122 such as temperature, photonic energy intensity, magnetic field intensity, or electrical field intensity. This step involves placing a first end of the optical fiber 100 into a pressurized reservoir filled with the core material 105. A second end of the optical fiber 100 is open to ambient air. Still, the invention is not limited in this regard as there are other known methods of filling a bore 103 of an optical fiber 100 with a core material 105. After step 210 is complete, control passes to step 212, where the first end and the second end of the optical fiber 100 are spliced to the ends of another optical fiber (for example, Corning SMF-28® fiber). After this step, control passes to step 214 where fabrication process 200 ends.

A person skilled in the art will appreciate that fabrication process 200 includes only the major steps of fabricating optical fiber 100. In this regard, fabrication process 200 is simply one embodiment of a fabrication process. The invention is not limited in this regard and any other fabrication process can be used without limitation.

Figure 4:
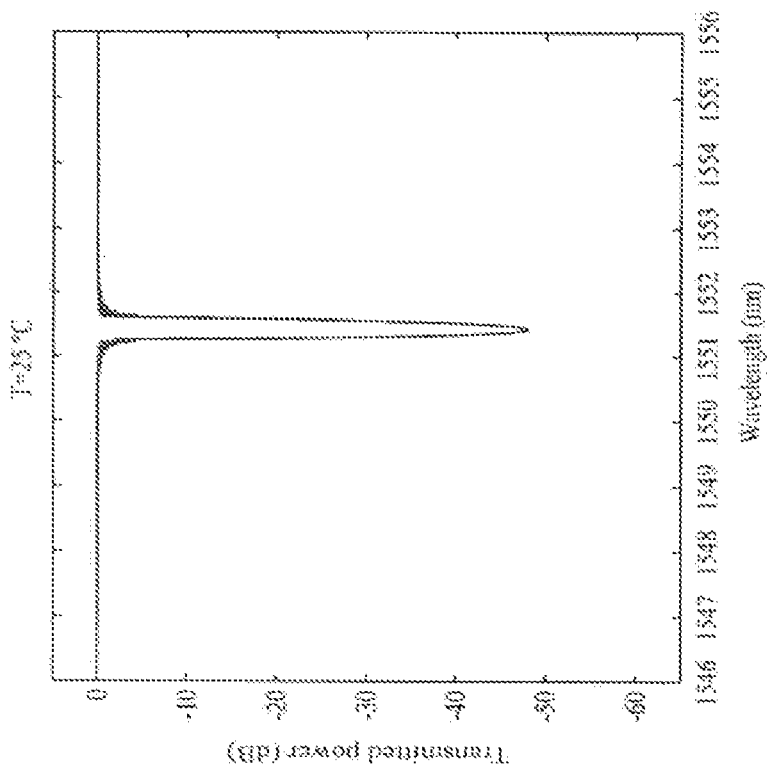
FIG. 4 is a graph illustrating a calculated transmission spectrum for an optical filter including an optical fiber with a core material at a second temperature that is useful for understanding the invention.
Figure 3:
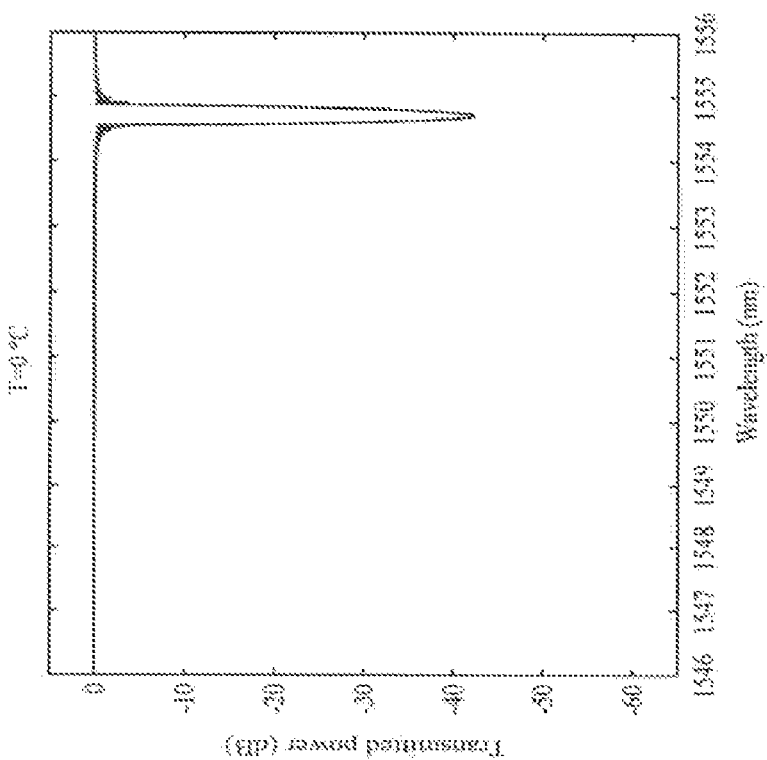
FIG. 3 is a graph illustrating a calculated transmission spectrum for an optical filter including an optical fiber with a core material at a first temperature that is useful for understanding the invention.
Figure 6:
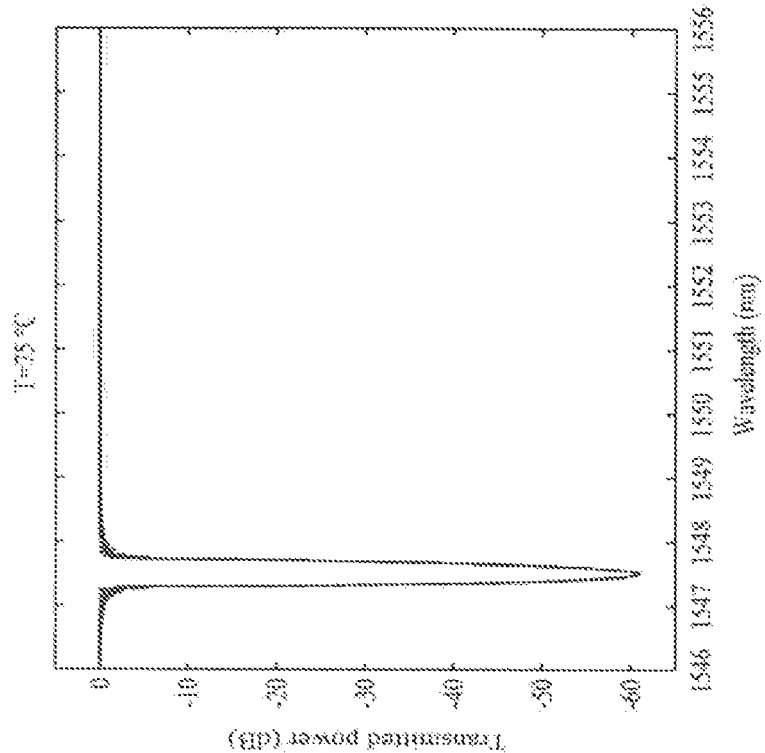
FIG. 6 is a graph illustrating a calculated transmission spectrum for an optical filter including an optical fiber with a core material at a fourth temperature that is useful for understanding the invention.
Figure 5:
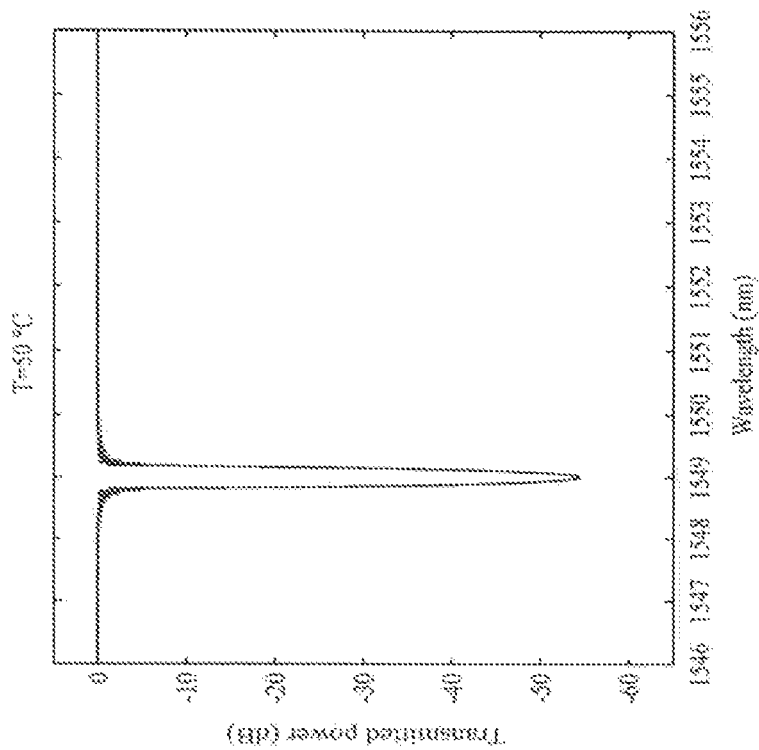
FIG. 5 is a graph illustrating a calculated transmission spectrum for an optical filter including an optical fiber with a core material at a third temperature that is useful for understanding the invention.

Referring now to FIGS. 3 through 6, there are provided a number of graphs illustrating calculated transmission spectra for an optical fiber 100 exposed to an environment in which a parameter of interest is varied. In FIGS. 3 through 6, the parameter of interest is temperature and the core material is selected so that it has an index of refraction that varies in response to temperature. However, it should be understood that similar results can be achieved with different core materials that have an index of refraction that varies in response to different parameters of interest. The mathematical model used to calculate transmission spectra assumed a structure such as would be produced by fabrication process 200, described above (in relation to FIG. 2). The optical fiber 100 has the following parameters: core material 105 refractive index $n_1$=1.5 (at a temperature of 25° Celsius), core material 105 refractive index temperature sensitivity $dn_1/dT$=−4.01× $10^{-4}$ (° Celsius)$^{-1}$, core diameter 108 $d_1$=1.4 micrometers, first optical cladding layer 104 refractive index $n_2$=1.444, first optical cladding layer 110 diameter $d_2$=40 micrometers, second optical cladding layer 106 refractive index $n_3$=1.444, grating period $\Lambda_{grating}$=535.28 nanometer, and grating length $L_1$=1 centimeter. The model assumes a sinusoidal grating in which the average index change is 8.5×$10^{-4}$ and the difference between the maximum and minimum index values in the grating is also 8.5×$10^{-4}$. FIG. 3 shows the calculated transmission spectrum for the optical fiber 100 with a core material at a first temperature of 0° Celsius. Similarly, FIGS. 4 through 6 show the calculated transmission spectra for the optical fiber 100 with a core material at different temperatures selected from the group consisting of 25° Celsius, 50° Celsius, and 75° Celsius, respectively.

As shown in FIGS. 3 through 6, the temperature of the core material determines the transmission spectrum of the optical fiber 100. The notch wavelength and notch width of the optical fiber 100 vary in response to the intensity of a parameter of interest applied to the core material occupying bore 103.

A person skilled in the art will also appreciate that the optical fiber 100 can be designed to operate at different bands (for example, a C-band 1530 nanometer to 1565 nanometer and the L-Band 1565 nanometer to 1625 nanometer) in the near infrared region of the electromagnetic spectrum. For example, an effective index of a guided mode equals 1.45. A grating period equals 535.28 nanometer. Here, the wavelength at which light couples from a forward propagating core mode to a reverse propagating core mode is equal to 1552.3 nanometer ($\lambda_B=2\times1.45\times535.28$; see Equation (1) above) which resides in the C-band near infrared region of the electromagnetic spectrum. Alternatively, an effective index of a guided mode equals 1.5. A grating period equals 535.28 nanometer. Here, the wavelength at which light couples from a forward propagating core mode to a reverse propagating core mode is equal to 1605.8 nanometer ($\lambda_B=2\times1.5\times535.28$; see Equation (1) above) which resides in the L-band near infrared region of the electromagnetic spectrum. In view of the forgoing, it should be appreciated that the refractive index $n_1$ of a core material 105, the refractive index $n_2$ of a first optical cladding layer 104, the refractive index of a second optical cladding layer 106 (provided the first optical cladding layer 104 is thin), the diameter 108 of bore 103, the diameter 110 of the first optical cladding layer 104, the diameter 112 of the second optical cladding layer 106, and a grating period $\Lambda_{grating}$ dictate the near infrared band in which the optical fiber 100 operates.

Figure 7:
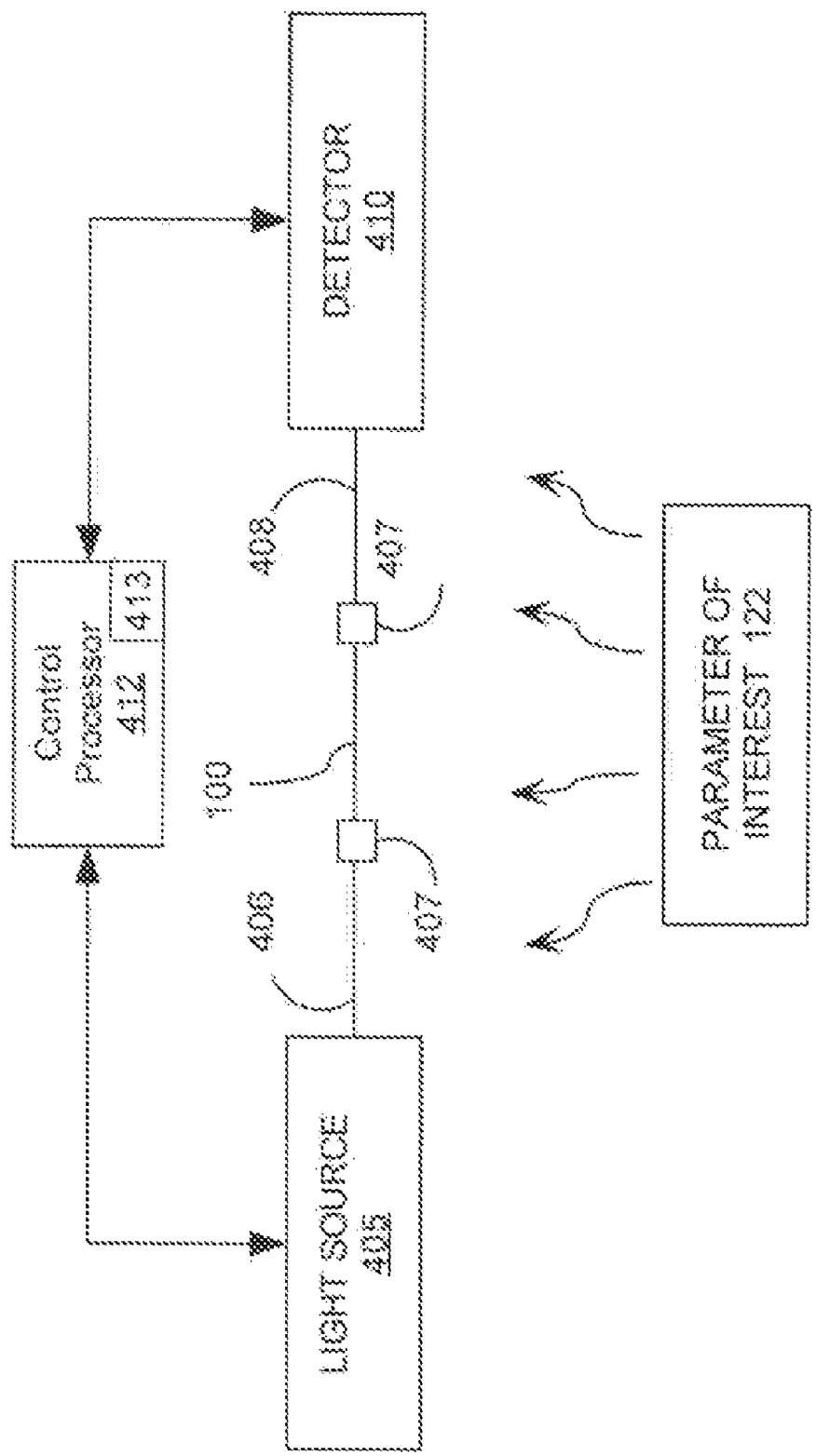
FIG. 7 is a block diagram of an optical fiber temperature sensor disposed between a light source and a detector that is useful for understanding the invention.
Figure 8:
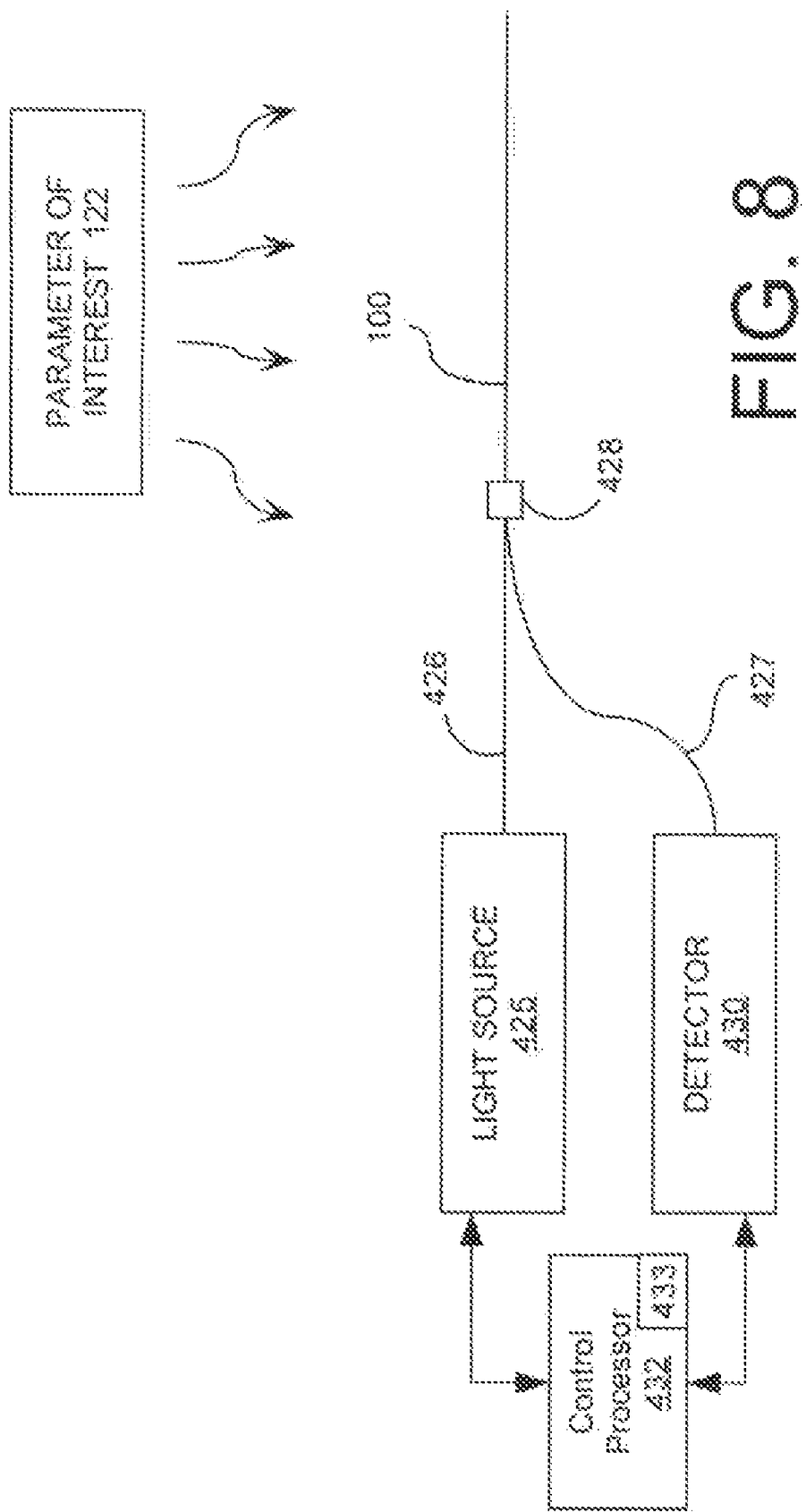
FIG. 8 is a block diagram of an optical fiber temperature sensor coupled to a light source and a detector that is useful for understanding the invention.
Figure 9:
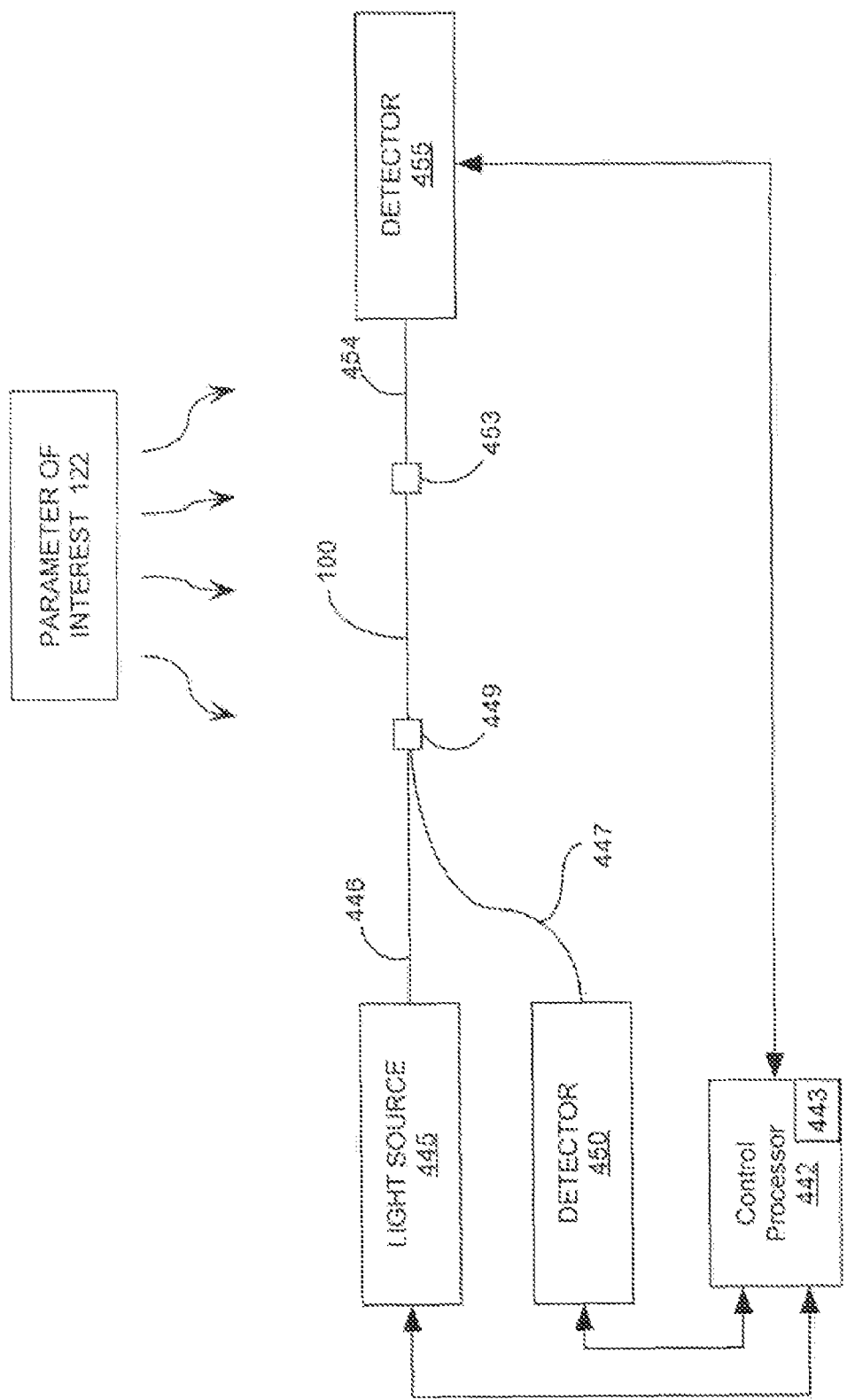
FIG. 9 is a block diagram of an optical fiber temperature sensor disposed between a light source and a first detector and coupled to a light source and a second detector that is useful for understanding the invention.

Referring now to FIGS. 7 through 9, shown is the optical fiber 100 of FIG. 1 utilized as a sensor for measuring a parameter of interest. As discussed, optical fibers are useful in measuring a parameter of interest because changes to the environment in which the fiber resides can result in changes to material properties of the optical fiber that are sufficient to alter one or more characteristics of the propagating light such as the amplitude, phase, frequency, spectral content, or polarization of the light. By detecting the change in one or more of these characteristics, a parameter of interest can be measured.

In the present invention, selected wavelengths of light propagating through the optical fiber 100 are reflected by one or more optical gratings 114-1 disposed within an optical cladding layer 104 surrounding the core 102 while other wavelengths of light propagate freely through optical fiber 100. The wavelengths of light reflected (the Bragg wavelengths) are dependent in part upon the index of refraction of the fluid in bore 103, as affected by a parameter of interest 122 applied to the fluid in bore 103. Accordingly, the parameter of interest 122 can be determined if the Bragg wavelengths of the reflected light are determined. Similarly, a parameter of interest 122 can be determined based on a change in a bandwidth of a transmission spectrum at a notch associated with the Bragg wavelength. As previously explained this change in bandwidth can also be measured as a change in total transmitted or reflected power through the optical fiber 100 when the source of optical energy is a broadband source.

A parameter of interest that can be measured includes the temperature of the immediate environment that the optical fiber 100 may be disposed in. Still, the invention is not limited in this regard. A person skilled in the art will appreciate that there are many applications wherein it may be desirable to measure a parameter of interest with an optical fiber such as optical fiber 100. Such parameters of interest include strain, electric field intensity, photonic energy intensity, and magnetic field intensity.

The optical fiber 100 can be utilized as a sensor for measuring a parameter of interest 122 such as temperature when light from a light source 405 is provided to the core 102 of optical fiber 100. The light waves interact with the optical grating(s) 114-1 while propagating along the longitudinal axis of optical fiber 100. Certain wavelengths are able to pass freely through optical fiber 100 while other wavelengths (the Bragg wavelength $\lambda_B$) are reflected by optical grating(s) 114-1. In the case where the optical fiber 100 is designed to measure temperature, the temperature of the core material 105 comprising core 102 can be determined based on the wavelength of the notch in the transmission spectrum, or the wavelength of the peak in the reflection spectrum. This can be accomplished in several ways with the use of an optical spectrum analyzer (OSA) to determine the location of the notch in the transmission spectrum or the location of the peak in the reflection spectrum. Similarly, the temperature of the core material 105 can be determined based on a change in total power contained in a broadband optical signal that is reflected from or transmitted through the optical fiber 100.

As discussed, the selected wavelengths of reflected light are determined in part by the index of refraction of a core material 105, the index of refraction of the first optical cladding layer 104, and the grating period of the optical grating(s) 114-1 inscribed in the first cladding layer 104. In the preferred embodiment of the invention, the optical fiber 100 has a core 102 comprised of a bore 103 that is filled with a fluid that is sensitive to a parameter of interest 122 such as temperature. Thus, for a short period grating the wavelength of the reflected light (the Bragg wavelength $\lambda_B$) is a function of the temperature of the core material 105. The optical fiber 100 can also be utilized to measure other parameters of interest 122 applied to the core 102. In such embodiments, it will be understood that the core material 105 is chosen so as to have an index of refraction that varies in response to a particular parameter of interest which is to be measured. Such parameters of interest 122 include electric field intensity, photonic energy intensity, or magnetic field intensity. Another parameter of interest that can be measured is strain on optical fiber 100 as discussed further below. Since the properties of the fluid in the bore 103 largely determine the characteristics of the transmission spectrum of the optical fiber 100, much greater temperature sensitivity can be provided than typical FBG temperature sensors provide.

Referring now specifically to FIG. 7, shown is the preferred embodiment optical fiber 100 of FIG. 1 being utilized as a sensor for measuring a parameter of interest 122. The optical fiber 100 is disposed between a light source 405 such as a broadband light source and a detector 410. For example, the broadband light source can include a superluminescent light emitting diode (SLED) or an amplified spontaneous emission source. A control processor 412 having at least one data store 413 can optionally be provided for performing selected processing operations which are described below in more detail. According to one embodiment, the detector 410 includes an optical spectrum analyzer (OSA). With the OSA, it is possible to see the spectral profile of an optical signal over a certain wavelength range. An optical fiber 406 and coupler 407 couple optical fiber 100 to light source 405. An optical fiber 408 and coupler 407 couple optical fiber 100 to detector 410. The detector 410 determines the location of the notch in the transmission spectrum for further determining a parameter of interest 122 as affecting the index of refraction of the fluid in the bore 103. Alternatively, the detector 410 can be a power detector. IF the light source 405 is a broadband light source, then the detector 410 can be used to measure a change in total power transmitted to detector 410 through the optical fiber 100. As previously explained, the change in total transmitted power will occur in a predictable way which varies in accordance with variations in the bandwidth of a transmission notch associated with the grating 114-1. This change in total power can be used to determine the parameter of interest 122.

In another embodiment of the invention, light source 405 includes a tunable laser which can sweep a narrow linewidth emission spectrum over a band of wavelengths. The detector 410 includes a power detector. The power detector 410 and the light source 405 can be controlled by the control processor 412. The power detector can be used to measure the loss of power due to the light reflected by the optical grating(s) 114-1. The location of an associated notch in the transmission spectrum can also be determined. For example, the location of the notch in the transmission spectrum can be determined by noting a measured reduction in optical energy arriving at detector 410 when the tunable laser is swept through particular wavelengths. According to one embodiment of the invention, these operations can be coordinated by the control processor 412.

Referring now to FIG. 8, shown is another embodiment of optical fiber 100 of FIG. 1 being utilized as a sensor for measuring a parameter of interest 122. The optical fiber 100 is optically coupled through a 50:50 coupler 428 to a light source 425 such as a broadband source and a detector 430 such as an optical spectrum analyzer (OSA). Optical fibers 426 and 427 couple source 425 and detector 430 to coupler 428. A control processor 432 having at least one data store 433 can be optionally provided for performing selected processing operations which are described below in more detail.

The detector 430 can be used to determine the location of the peak in the reflection spectrum of the optical energy provided from light source 425 and reflected by fiber 100. The wavelength of this peak can be used to determine a parameter of interest 122 as previously explained. The parameter of interest will affect the index of refraction of the fluid in bore 103, thereby changing the location of the peak in the reflection spectrum of optical energy from fiber 100. As discussed, such parameters of interest 122 include temperature, strain, electric field intensity, photonic energy intensity, and magnetic field intensity.

In another embodiment of the invention, the optical fiber 100 is optically coupled to a light source 425 such as the tunable laser and a detector 430 such as a power detector. The power detector 430 determines the location of the peak in the reflection spectrum of the light provided from light source 425 to determine a parameter of interests as affecting the index of refraction of the fluid in bore 103. The location of the peak in the reflection spectrum can be determined by noting a measured increase in optical energy arriving at detector 430 when the tunable laser is swept through particular wavelengths. Once again, the location of such peak can be used to determine a parameter of interest.

In another embodiment of the invention, and still referring to FIG. 8, the optical fiber 100 is optically coupled to a light source 425 such as a broadband source or a fixed laser and a detector 430 such as a power detector. The power detector 430 determines the amount of power of the reflected optical energy from fiber 100 to determine a parameter of interest 122 as affecting the optical fiber 100. As discussed, such parameters of interest 122 include temperature, strain, electric field intensity, photonic energy intensity, and magnetic field intensity.

Referring now to FIG. 9, there is shown another embodiment of the optical fiber 100 of FIG. 1 being utilized as a sensor for measuring a parameter of interest 122 such as temperature. The optical fiber 100 is optically coupled to a light source 445 and to a second detector 450 which is a power detector through a 50:50 coupler 449. Optical fibers 446 and 447 couple light source 445 and second detector 450 to 50:50 coupler 449. The optical fiber 100 is disposed between light source 445 and a first detector 455. A coupler 453 couples optical fiber 100 to first detector 455. The first detector 455 is an optical spectrum analyzer (OSA) which determines the location of the notch in the transmission spectrum of the propagating light. The power detector 450 measures the amount of power associated with the reflected light. A control processor 442 having at least one data store 443 can optionally be provided for performing selected processing operations which are described in more detail in relation to FIG. 10.

Control processors 412, 432, 442 can be any suitable processing element. For example, control processors 412, 432, 442 can be implemented as an application specific integrated circuit (ASIC) or as a microprocessor programmed with a set of instructions. Alternatively, the control processors can be implemented in the form of general purpose computers programmed with a set of instructions. The control processors can also include suitable communication interfaces to communicate measured data regarding parameters of interest to a user interface (not shown).

Referring now to FIG. 10, shown is a flow diagram of a method of determining a parameter of interest 500 such as temperature utilizing the optical fiber 100 of FIG. 1 that is useful for understanding the invention. The method of determining a parameter of interest 500 utilizes an arrangement as shown in FIG. 7, FIG. 8 or FIG. 9 depending on the particular implementation of the method as will be understood from the following detailed description.

The method begins in step 502 and continues to step 504. Step 504 includes propagating optical energy substantially confined to the core of the optical fiber having (1) a core material with optical properties, e.g. index of refraction and optical loss that are variable in response to a parameter of interest and 122 and (2) a grating formed in the first cladding layer 104 of the optical fiber. The optical fiber 100 shown in FIGS. 7-9 can be used for this purpose. Thereafter, the method continues with step 506.

In step 506, the optical fiber is positioned in an environment comprising the parameter of interest. By positioning the optical fiber in such an environment, the parameter of interest can cause a change in the optical properties of optical fiber 100. In step 508, the process can continue with the step of measuring a value of one or more spectral or power characteristics of the optical energy transmitted through the optical fiber 100 or reflected by the optical fiber 100. Such variations will necessarily result from the change in the core material index of refraction or optical loss, or other optical fiber 100 characteristics, and the resulting different interaction of the optical energy with the optical grating formed in the cladding. Any one of the measurement setups as described in FIGS. 7 through 9 can be used for the purpose of performing step 508.

Thereafter, in step 510, the process can continue with a step that includes evaluating the measured results obtained in step 508. In particular, step 510 includes determining a value for the parameter of interest based on measuring one or more spectral, power, phase, delay or polarization characteristics of the optical energy transmitted through the optical fiber or reflected by the optical fiber. This step can include an evaluation of the transmitted optical spectrum, the reflected optical spectrum, the transmitted optical power, and/or the reflected optical power, or the phase, delay, or polarization of the transmitted or reflected light. These values can be used to determine the value of a parameter of interest.

In step 510, the value of a parameter of interest 122 can be determined in any one of several ways. For example, in the embodiment of FIG. 7, this step includes determining a wavelength of a notch in a spectrum of optical energy transmitted through the optical fiber 100. The wavelength of the notch is determined using detector 410. In the embodiment of FIG. 8, step 510 could include determining a wavelength of a peak in a spectrum of optical energy reflected from the optical fiber 100. The wavelength of the peak is determined using the detector 430. Similarly, such detectors could be used for measuring a bandwidth of the notch or a change in power associated therewith. After this step, control passes to step 512 where the method of determining a parameter of interest 500 ends.

Those skilled in the art will appreciate that the processes associated with steps 504, 508, and 510 can be automated. For example, one or more of these steps can be performed under the control of a control processor 412, 432, 442. The control processor 412, 432, 442 respectively can communicate control signals to a light source 405, 425, 445. For example, the control processor can communicate control signals to turn the source on and off, control an output wavelength of the source, determine whether the light output should be broadband or narrowband, and/or control an intensity of the source. The control processor 412, 432, 442 can also be used to coordinate the operation of one or more detectors for performing automated measurements, including measurement of a wavelength and bandwidth of a transmission notch. Similarly, the control processor 412, 432, 442 can be used to obtain automated measurements of detected power. Such automated measurement techniques are well known in the art and therefore will not be described here in detail. The measured data from the detectors can be communicated to a respective control processor for performing the processing steps in 510.

Notably, in FIG. 7-9, the detectors 410, 430, 450 and 455 can optionally include one or more different functions that include spectrum analysis and power measurements. Thus, such detectors can simultaneously provide information regarding both a bandwidth and the location of the notch in the transmission spectrum. This capability can be a significant advantage under certain circumstances. Using both of these measurements concurrently can allow a single optical fiber 100 to be used for simultaneous measurement of a parameter of interest 122 and a stress or strain applied to the optical fiber.

Stress or strain applied to optical fiber 100 can cause a variation in a Bragg wavelength associated with a grating 114-1. Such a variation caused by stress or strain can make it difficult to determine whether a particular wavelength of a transmission minimum or notch is in fact resulting from a change in a parameter of interest 122, a change in stress applied to the optical fiber, or to a combination of these factors. In contrast, a bandwidth of a transmission notch caused by a grating 114-1 is generally not sensitive to variations in strain or stress applied to the optical fiber 100. Consequently, the variation in the bandwidth of a transmission notch can be used to measure a parameter of interest 122. For example, if the optical fiber 100 has been properly calibrated, then the variation in the bandwidth of the transmission notch can be used to obtain an accurate measurement of the temperature of an optical fiber.

If the optical fiber 100 has been properly calibrated, then it should be possible to determine an expected Bragg wavelength of a transmission notch associated with a grating 114-1 at that temperature. If the actual measured value of the Bragg wavelength obtained does not correspond to the expected value at a given temperature, and the optical fiber 100 is isolated from other parameters of interest, then it can be understood that any variation from the expected value can be attributed to a strain applied to the optical fiber 100. If the optical fiber is properly calibrated, then the change in Bragg wavelength attributable to strain on the optical fiber 100 can be used to determine an actual amount of strain applied to the optical fiber 100.

All of the apparatus, methods and algorithms disclosed and claimed herein can be made and executed without undue experimentation in light of the present disclosure. While the invention has been described in terms of preferred embodiments, it will be apparent to those of skill in the art that variations may be applied to the apparatus, methods and sequence of steps of the method without departing from the concept, spirit and scope of the invention. More specifically, it will be apparent that certain components may be added to, combined with, or substituted for the components described herein while the same or similar results would be achieved. All such similar substitutes and modifications apparent to those skilled in the art are deemed to be within the spirit, scope and concept of the invention as defined.

We claim:

1. An optical fiber device for measuring a parameter of interest, comprising:
    an optical fiber including
        an elongated cylindrical core formed of a core material that is optically transmissive, the core material having optical properties dynamically variable responsive to said parameter of interest, wherein said parameter of interest is a member of the group consisting of temperature and strain,
        a first optical cladding layer disposed on the core, and
        at least one optical grating disposed within said first optical cladding layer, said optical grating varying the index of refraction of the first optical cladding layer for modifying a propagation path of selected wavelengths of light provided to said core by a source of light;
    a first detector optically coupled to said optical fiber and configured for measuring one or more first characteristics of selected wavelengths of light propagated along a length of said optical fiber for determining said parameter of interest; and
    a control processor communicatively coupled to said first detector and configured for determining a value of said parameter of interest from said first characteristics of said wavelengths of light measured by said first detector;
    wherein the core is defined by a bore that is filled with said core material including a liquid or a fluid.

2. The optical fiber device of claim 1, wherein said at least one optical grating is at least one of an apodized grating, a chirped grating, a blazed grating, or an amplitude modulated grating.

3. The optical fiber device of claim 2, wherein said at least one optical grating comprises a plurality of optical gratings.

4. The optical fiber device according to claim 1, wherein said at least one optical grating is comprised of a portion of said first optical cladding layer which has an index of refraction that is modulated in a periodic pattern along a length of said optical fiber.

5. The optical fiber device according to claim 4, wherein said periodic pattern is comprised of a sinusoidal variation in said index of refraction.

6. The optical fiber device according to claim 5, wherein said at least one optical grating is an apodized grating, a chirped grating, a blazed grating, or an amplitude modulated grating.

7. The optical fiber device according to claim 6, where in said at least one optical grating comprises a plurality of optical gratings.

8. The optical fiber device according to claim 1, further comprising a second optical cladding layer disposed on said first optical cladding layer.

9. The optical fiber device according to claim 8, wherein said second optical cladding layer has a second cladding layer index of refraction less than the index of refraction of said core.

10. The optical fiber device according to claim 1, wherein said core material is a fluid selected from the group of a fluid having an index of refraction between 1.40 and 1.80 at room temperature.

11. The optical fiber device according to claim 1, wherein said core material is a fluid selected from the group consisting of a thermo-optic, piezo-optic and magneto-optic fluid.

12. The optical fiber device according to claim 1, wherein said core material is a liquid crystal.

13. The optical fiber device according to claim 1, wherein said source of light is selected from the group consisting of a broadband light source, a tunable wavelength laser, and a fixed wavelength laser.

14. The optical fiber device according to claim 1, wherein said first detector is an optical spectrum analyzer.

15. The optical fiber device according to claim 14, wherein said one or more first characteristics of said selected wavelengths having a propagation path modified by said optical grating is a wavelength of a minimum in the transmission spectrum.

16. The optical fiber device according to claim 14, wherein said one or more first characteristics of said selected wavelengths having a propagation path modified by said optical grating is a wavelength of a maximum in the reflection spectrum.

17. The optical fiber device according to claim 13, wherein said first detector is a power detector responsive to total optical power.

18. The optical fiber device according to claim 17, wherein said selected wavelengths of light having a propagation path modified include selected wavelengths of light that have been reflected by said optical gratings and said one or more first characteristics of said selected wavelengths measured by said power detector is an amount of power associated with said selected wavelengths of light.

19. The optical fiber device according to claim 13, further comprising a second detector optically coupled to said optical fiber and configured for measuring one or more second characteristics of said selected wavelengths for determining said parameter of interest, said second detector communicatively coupled to said control processor, and wherein said control processor is further configured for determining said value of said parameter of interest from said first and said second measured characteristics.

20. The optical fiber device according to claim 19, wherein said source of light is a broadband light source, said first detector is an optical spectrum analyzer and said second detector is a power detector responsive to total optical power, and wherein said optical spectrum analyzer determines a wavelength of a minimum in the transmission spectrum and the power detector measures an amount of power associated with selected wavelengths of light that have been reflected by said optical gratings.

21. A method of measuring a parameter of interest with an optical fiber device, comprising the steps of:
  selecting a core material to include a liquid or a fluid;
  selecting a parameter of interest from a group consisting of temperature and strain;
  propagating light within a core of an optical fiber, which has said core material having an index of refraction continuously variable over a predetermined range of values responsive to said parameter of interest;
  modifying a propagation path of selected wavelengths comprising said light using a combination of said continuously variable index of refraction of said core and an optical grating inscribed in a cladding layer disposed about an outer periphery of said core;
  measuring one or more characteristics of selected wavelengths of light having a propagation path modified by said continuously variable index of refraction and said optical grating for determining a parameter of interest; and
  determining a value for said parameter of interest based on said one or more measured characteristics of said selected wavelengths.

22. The method according to claim 21, wherein the step of propagating light within the core of an optical fiber further comprises selecting a light source from the group consisting of a broadband light source, a tunable wavelength laser and fixed wavelength laser.

23. The method according to claim 21, wherein said step for measuring said one or more characteristics of selected wavelengths of light comprises analyzing at least one of a power and a spectral content of said selected wavelengths of light.

24. The method according to claim 23, wherein said step of measuring the one or more characteristics of selected wavelengths of light further comprises measuring a wavelength minimum in the transmission spectrum.

25. The method according to claim 23, wherein said measuring step further comprises determining a wavelength of a maximum in the reflection spectrum.

26. The method according to claim 23, further comprising the step of selecting a detector to be a power detector responsive to total optical power.

27. The method according to claim 21, wherein said measuring step comprises measuring a wavelength minimum in a transmission spectrum and an amount of power associated with selected wavelengths of light reflected by said optical grating.

28. The method according to claim 21, further comprising selecting said core material to include a fluid selected from the group consisting of a thermo-optic, piezo-optic and magneto-optic fluid.

* * * * *